United States Patent

Chi

[19]

[11] Patent Number: 6,111,925
[45] Date of Patent: Aug. 29, 2000

[54] CLOCK SYNCHRONIZED DELAY SCHEME USING EDGE-TRIGGERED DELAY LINES AND LATCHES WITH ONE CLOCK LOCK TIME

[75] Inventor: Min-Hwa Chi, Hsinchu, Taiwan

[73] Assignee: Vanguard International Semiconductor Corporation, Hsin-Chu, Taiwan

[21] Appl. No.: 09/047,541

[22] Filed: Mar. 25, 1998

[51] Int. Cl.[7] ................................. H04L 7/00; H03L 7/00
[52] U.S. Cl. .................. 375/354; 327/277; 327/161; 327/263; 327/276; 327/284; 713/401
[58] Field of Search .................. 375/354, 371, 375/377; 713/400, 401, 500, 501; 327/141, 161, 263, 269, 270, 271, 276, 277, 278, 284, 261

[56] References Cited

U.S. PATENT DOCUMENTS

| 5,489,864 | 2/1996 | Ashuri ..................................... 327/161 |
| 5,614,845 | 3/1997 | Masleid ..................................... 326/93 |
| 5,663,767 | 9/1997 | Rumreich et al. ....................... 348/537 |
| 5,892,384 | 4/1999 | Yamada et al. .......................... 327/277 |
| 5,923,613 | 7/1999 | Tien et al. ............................... 365/233 |

OTHER PUBLICATIONS

"A 2.5v Delay Locked Loop For An 18mb, 500 mbls DRAM" T. Lee et al. IEEE International Solid State Circuits Conf. Paper # FA 18.6, p. 300, 1994.
"A 1 psJitter 2 clock Cycle Lock Time CMOS Digital clock Generator Based on An Interlequed Synchronous Mirror Delay Scheme", T. Saeski et al, Digest of Technical Papers—Symposium on vLSI Circuit, IEEE, 1997.

T. Saeki et al. "A 2.5ns clock access 250mhz 256mb 5DRAM with a synchronous Mirror Delay", IEEE 3International solid State Circuits, Conference Paper# SP23.4, p. 374–S, 1996.

*Primary Examiner*—Stephen Chin
*Assistant Examiner*—Betsy L. Deppe
*Attorney, Agent, or Firm*—George O. Saile; Stephen B. Ackerman; Billy Knowles

[57] ABSTRACT

A timing signal synchronization circuit to align an internal timing clock within an integrated circuit with an external system clock with minimum skew and within one cycle of the external system clock is disclosed. A timing signal synchronization circuit has an input buffer subcircuit to receive and delay the external system clock. A fixed delay line circuit is connected to the input buffer subcircuit to delay the received external system clock by a second delay factor to create a first timing signal. The first timing signal is the input to a first and a second measurement delay line. Each will respectively measure a first part and a second part of a period of the first timing signal. A first latch array will receive the measurement and create a first latch signal. A second latch array will receive the measurement and create a second latch signal. A variable delay line will receive the first and second latch signals, and adjust a delay time to values of the measurements of the first and second parts of the period of the first timing signal less the second delay factor. The variable delay line will receive and delay the first timing signal by the delay time to create a second timing signal. An internal buffer subcircuit will receive, buffer, amplify, and delay by a third delay factor the second timing signal to create the internal timing clock that is synchronized with the external system clock.

10 Claims, 4 Drawing Sheets

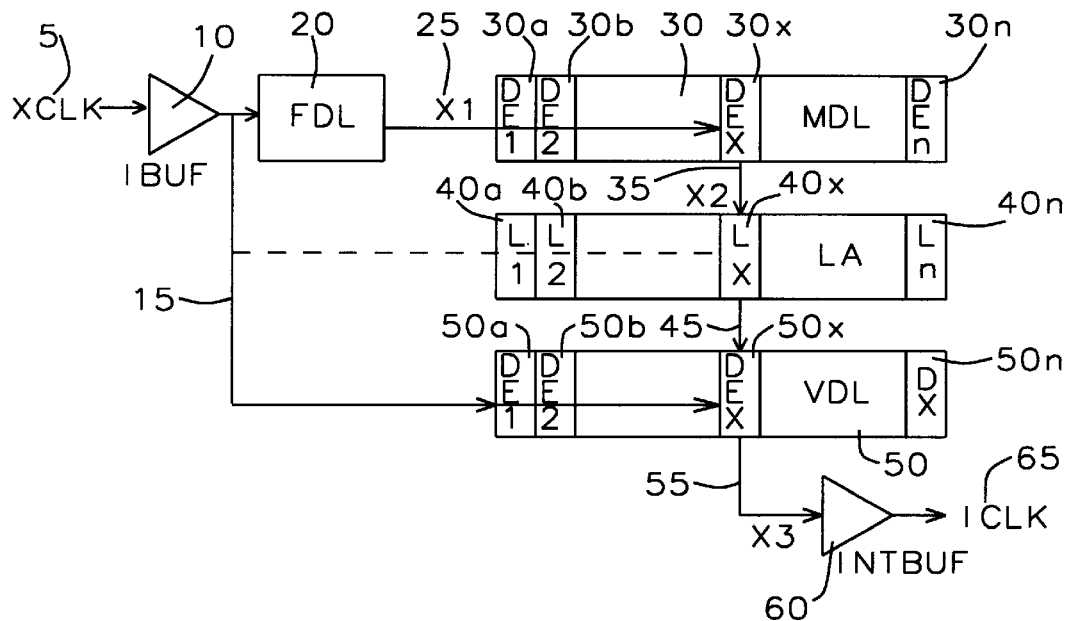
FIG. 1 - Prior Art
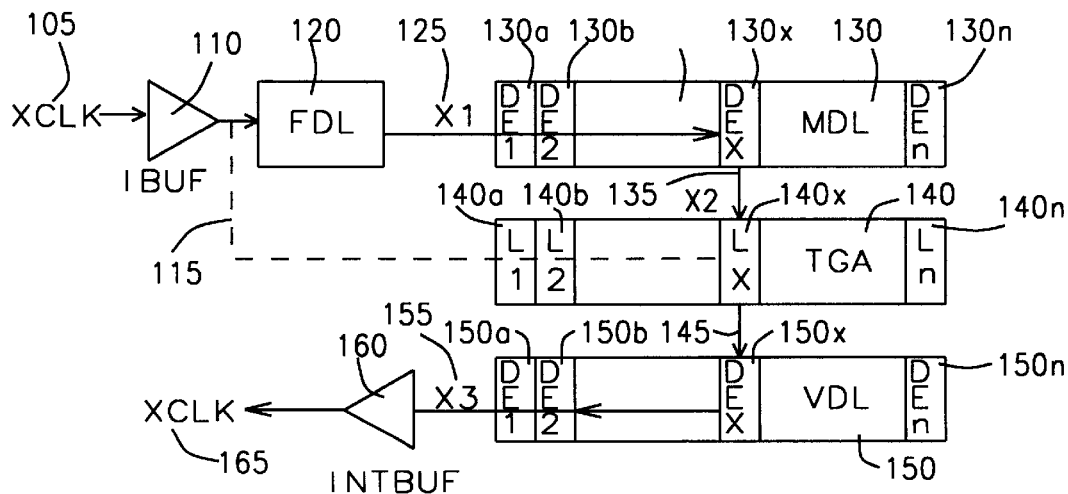
FIG. 2

FIG. 3 – Prior Art

CLOCK SYNCHRONIZED DELAY SCHEME USING EDGE-TRIGGERED DELAY LINES AND LATCHES WITH ONE CLOCK LOCK TIME

RELATED PATENT APPLICATIONS

"An Edge Triggered Delay Line, A Multiple Adjustable Delay Line Circuit, And An Application of Same," Ser. No. 09/047,540, Filing Date Mar. 25, 1998, Assigned to the Same Assignee as the Present Invention.

FIELD OF THE INVENTION

This invention relates to circuits that will synchronize the internal timing or clock signals within an integrated circuit such as a synchronous dynamic random access memory (SDRAM) to external timing or clock signals. More particularly this invention relates to circuits that can synchronize the internal clock signals with the external clock within one cycle of the external clock.

DESCRIPTION OF RELATED ART

As is well known in the art, most digital logic implemented on integrated circuits is clocked synchronous sequential logic. An external system clock is generally received with an input buffer and then further shaped and redriven to the internal circuitry by an internal buffer. The time delay of the input buffer and the internal buffer will skew the internal clock from the external clock. This clock skew will cause signals that are to be transferred from the integrated circuit to be out of synchronization with the external system clock. In cases such as SDRAM, this skew will make the minimum data access time equal to two external system clocks. Where if the skew were eliminated the minimum data access time could be one clock cycle.

It is well known in the art, that two timing signals can be synchronized with phase locked loops (PLL) or delayed locked loops (DLL). The phase locked loop and the delay locked loop as described in "A 2.5V Delay Locked Loop For An 18 Mb, 500 MB/s DRAM", T. Lee et al., IEEE International Solid State Circuits Conference, Paper #FA18.6, p 300, 1994, may require more than 50 cycles of the external system clock to achieve synchronization. Often, the internal clock will be activated and deactivated to control the activity of the integrated circuit and consequently the power dissipation of the integrated circuit. Since the phase locked loops (PLL) or delayed locked loops (DLL) require at least 50 cycles to achieve synchronization, the phase locked loops (PLL) or delayed locked loops (DLL) cannot be deactivated easily to conserve power. This can cause undesirably larger power dissipation within integrated circuits such as the SDRAM.

To overcome this problem, two types of clock synchronization circuits, the latched type clock synchronized delay circuit (CSD) and the synchronous mirror delay circuit (SMD), have been developed in the art. The latched type clock synchronized delay circuit as described in "A 1 ps Jitter 2 Clock Cycle Lock Time CMOS Digital Clock Generator Based On An Interleaved Synchronous Mirror Delay Scheme" T. Saeki, H. Nakamura, and J. Shimizu, Digest of Technical Papers—Symposium on VLSI Circuit, IEEE, 1997, is shown in FIG. 1. The input buffer 10 receive the external system clock 5. The input buffer 10 will have a delay factor designated $d_1$. The output 15 of the input buffer 10 will be a first timing clock $X_0$ that is the input to a fixed delay line 20. The fixed delay line 20 will have a delay that is a second delay factor (d1+d2). The delay of the fixed delay line will be determined generally by the delay of a plurality of serially cascaded inverters. The delay of the inverters will generally be on the order of 10–20 ps.

The output 25 of the fixed delay line 20 will be a second timing clock $X_1$ and is the input of the measurement delay line 30. The measurement delay line 30 will be comprised of a plurality of delay elements 30a, 30b, . . . , 30x, . . . , 30n typically are individual stages of a shift register with a control gate. Each delay element 30a, 30b, . . . , 30x, . . . , 30n has an output 35 that is connected to the latch array 40. The latch array 40 has a plurality of parallel latches 40a, 40b, . . . , 40x, . . . , 40n. When the delayed signal from the measurement delay line 30 has aligned with a second pulse of the first timing clock 15, the latch 40x will be triggered.

Each output 45 of the plurality of latches 40a, 40b, . . . , 40x, . . . , 40n will be connected to the variable delay line 50. The variable delay line 50 will have a plurality of serially cascaded delay elements 50a, 50b, . . . , 50x, . . . , 50n. The first timing signal 15 will transferred through each of the serially cascaded delay elements 50a, 50b, . . . , 50x, . . . , 50n until it reaches the selected delay element 50x that is gated by the latch 40x. The output 55 of the variable delay line 50 is the third timing signal $X_3$ and will be the input to the internal buffer 60. The internal buffer 60 will amplify and buffer the third timing signal 55 for transmission to the internal circuitry of the integrated circuit.

The delay of the internal buffer 60 is designated $d_2$, thus the delay of the fixed delay line 20 will be the sum of the delay of the input buffer 10 and the delay of the internal buffer 60. The measured period $\tau_m$ from the measurement delay line 30 will be the difference of the period $\tau_{ck}$ of the external system clock 5 and the second delay factor (d1+d2). That is:

$$\tau_m = \tau_{ck} - (d1+d2).$$

The time to determine the measured period $\tau_m$ will be in the first cycle of the external system clock 5. The synchronization will occur in the second cycle. The variable delay line 50 will delay the first timing signal 15 by the measured period of time $\tau_m$. This will make the internal clock 65 synchronized with the external system clock 5 after two cycles from activation.

The synchronous mirror delay circuit, as described in T. Saeki, H. Nakamura, and J. Shimizu and "A 2.5 ns clock access 250 Mhz 256 Mb SDRAM with a synchronous mirror delay", T. Saeki et al., IEEE International Solid State Circuits Conference, Paper # SP23.4, p. 374–375, 1996 is shown in FIG. 2. The external system clock 105 is the input of the input buffer 110. The delay time of the input buffer 110 will designated the first delay factor d1.

The output 115 of the input buffer 110 will be the first timing signal $X_0$ and is connected to the fixed delay line 120. The output 125 of the fixed delay line 120 will be a second timing signal $X_1$ and will be delayed from the first timing signal 115 by a second delay factor d1+d2.

The second timing signal 125 will be the input to the measurement delay line 130. The measurement delay line 130 is composed of a plurality of serially cascaded delay elements 130a, 130b, . . . , 130x, . . . , 130n. As with the latched-type clock synchronized delay circuit, each delay element is a stage of a shift register with control gates. Each delay element 130a, 130b, . . . , 130x, . . . , 130n has an output 135 that is connected to the transfer gate array 140.

The transfer gate array 140 is composed of a plurality of transfer gates 140a, 140b, . . . , 140x, . . . , 140n. The first timing signal 115 is connected to each of the transfer gates. When the delayed second timing signal 135 has been delayed by an amount that will align the first cycle of the delayed second timing signal 135 with a second cycle of the first timing signal 115, one of the transfer gates 140x will be activated. The delayed second timing signal 135 will be transferred through the selected transfer gate 140x to the variable delay line 150.

The variable delay line 150 has a plurality of serially connected delay elements 150a, 150b, . . . , 150x, . . . , 150n. Each delay element 150a, 150b, . . . , 150x, . . . , 150n has an input that is connected to the output 145 of the transfer gate array 140. The one transfer gate 140x that is activated when the first pulse of the delayed second timing signal 135 is aligned with the first timing signal 115, is connected to the delay element 150x. The transferred delayed second timing signal 145 will be transferred and delayed through the variable delay line to form the third timing signal $X_3$ 155.

The third timing signal 155 is the input to the internal buffer 160. The internal buffer 160 will amplify, buffer, and delay the third timing signal 155 to form the internal clock 165. The delay of the internal buffer will be a third delay factor d2 and will align the internal clock 155 with the external system clock 105.

Refer now to FIG. 3 for a discussion of the method employed by the latched clock synchronized delay circuit and the synchronous mirror delay to synchronize an internal clock ICLK 325 with an external system clock XCLK 300. The external system clock XCLK 300 is received and delayed by a first delay factor $t_1$ 330 to form the first timing signal $X_0$ 305. The first timing signal $X_0$ 305 is delayed by a second delay factor $t_2$ 335 to form the second timing signal $X_1$ 310. The second delay factor $t_2$ 335 is generally the sum of the first delay factor $t_1$ 330 and the fifth delay factor $t_5$ 350 which is the delay between a fourth timing signal $X_3$ 320 and the internal clock ICLK 325. That is:

$t_2 = t_1 + t_5$.

The second timing signal $X_1$ 310 will then be successively delay until its first leading edge 312 is aligned with the leading edge 302 of the external system clock XCLK 300. This will create a third timing signal $X_2$ 315. The time delay between the second timing signal $X_1$ 310 and the third timing signal $X_2$ 315 will be the measured delay time $t_3$ 340. The measured delay time $t_3$ 340 will be the difference between the period $t_{ck}$ 360 of the external system clock XCLK 300 and the second delay factor $t_2$ 335. That is $t_3 = t_{ck} - t_2$ or $t_3 = t_{ck} - (t_1 + t_5)$.

The fourth timing signal $X_3$ 320 will be formed by delaying the third timing signal by the variable delay time $t_4$ 345. The leading edge of the fourth timing signal $X_3$ 320 will be misaligned with the third rising edge 304 of the external clock XCLK 300 by the fifth delay factor $t_5$ 350.

An internal buffer will amplify, the fourth timing signal $X_3$ 320 and delay the fourth timing signal $X_3$ 320 by the fifth delay factor $t_5$ 350 to form the internal clock ICLK 325. The internal clock ICLK 325 will now be aligned with the external clock 300.

U.S. Pat. No. 5,614,845 (Masleid) describes a clock regulator that will provide two control timing references per clock cycle. The regulator has two phase detectors and two phase aligner circuits to independently align the rising edge and the falling edge of the clock to create the two timing references.

U.S. Pat. No. 5,663,767 (Rumreich et al.) describes a clock retiming apparatus for aligning a video clock edge with a horizontal synchronization signal of a video signal by using latched outputs of delay lines. The outputs of the delay lines are selected according to their alignment with the horizontal synchronization signal.

U.S. Pat. No. 5,48,664 (Ashuri) discloses an integrated circuit for deskewing and adjusting a delay of a synthesized waveform. The synthesized waveform is initially produced by a digital-to-time domain converter, which is coupled to a synchronous delay line and a pattern ROM through a shifter and a pattern register. The synchronous delay line generates a plurality of taps in response to a reference signal. Each one of the taps has a unit delay and is coupled to the digital-to-time domain converter. The integrated circuit described comprises a microdelay calibration circuit, a deskew control circuit, and a delay interpolation circuit. The microdelay calibration circuit is coupled to the synchronous delay line and the deskew control circuit. The deskew control circuit is further coupled to the shifter and the delay interpolation circuit. The interpolation circuit receives the output of the digital-to-time domain converter and outputs a deskewed synthesized waveform.

SUMMARY OF THE INVENTION

An object of this invention is to create an internal clock or timing signal within an integrated circuit that is aligned with an external clock or timing signal.

Another object of this invention is to create an internal clock or timing signal within an integrated circuit that has minimum skew with an external clock or timing signal.

Further another object of this invention is to synchronize an internal clock or timing signal with an external clock or timing signal within one timing period or cycle of activation of the external clock or timing signal.

To accomplish these and other objects a timing signal synchronization circuit has an input buffer subcircuit to receive, buffer, and amplify the external timing signal. The input buffer subcircuit has a first delay factor that is a delay time of a received external signal from the external timing signal. A fixed delay line circuit is connected to the input buffer subcircuit to delay the received external timing signal by a second delay factor to create a first timing signal. The first timing signal is the input to a first measurement delay line. The first measurement delay line will measure a first part of a period of the first timing signal and will retain the measurement of the first part of the period of the first timing signal. Additionally the first timing signal is the input to a second measurement delay line. The second measurement delay line will measure a second part of the period of the first timing signal and will retain the measurement of the second part of the period of the first timing signal.

A first latch array is connected to the first measurement delay line to receive the measurement of the first period and to create a first latch signal. While a second latch array is connected to the second measurement delay line to receive the measurement of the second period and to create a second latch signal. A variable delay line connected to the first and second latch arrays to receive the first and second latch signals to adjust a delay time of the variable delay line to values of the measurements of the first and second parts of the period of the first timing signal less the second delay factor. The variable delay line is connected to the fixed delay line to receive the first timing signal and to delay the first timing signal by the delay time the variable delay line to create a second timing signal.

An internal buffer subcircuit will receive, buffer, amplify, and delay by a third delay factor the second timing signal to create the internal timing signal that is synchronized with the external timing signal to circuitry within the integrated circuit.

BRIEF DESCRIPTION OF THE DRAWINGS

FIG. 1 is a block diagram of a latched clock synchronized delay circuit of the prior art.

FIG. 2 is a block diagram of a synchronous mirror delay circuit of the prior art.

DETAILED DESCRIPTION OF THE INVENTION

Figure 3:
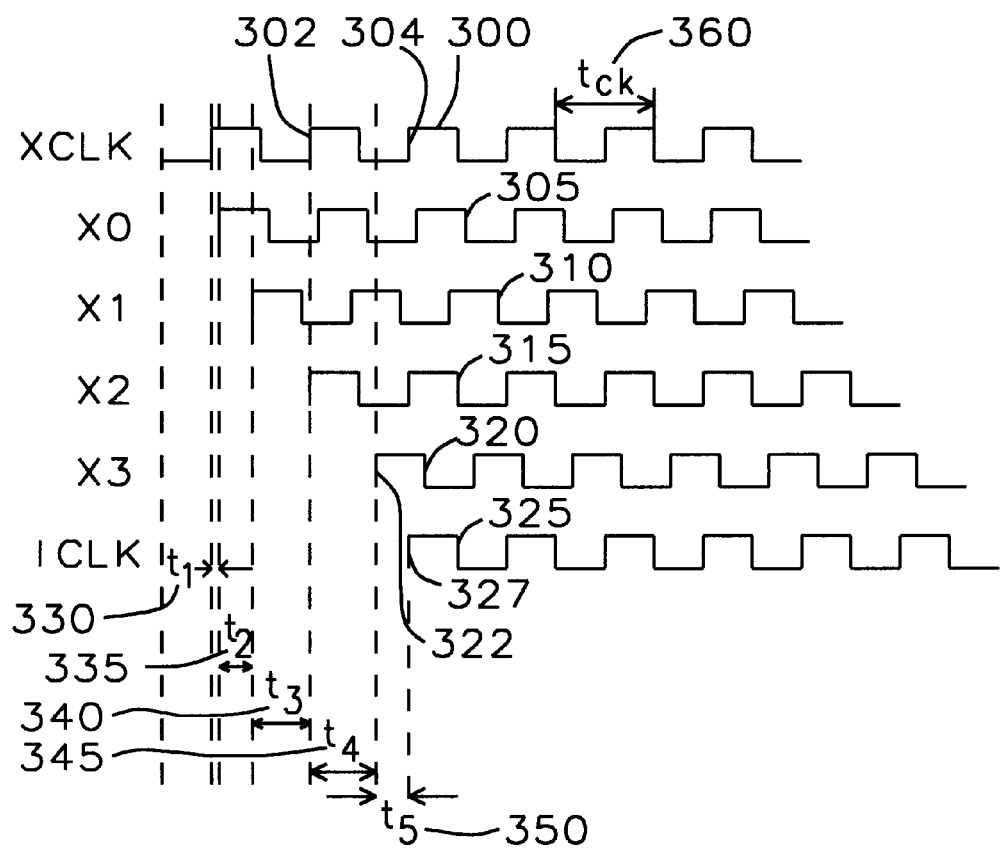
FIG. 3 is a timing diagram of a method to synchronize an internal clock of an integrated circuit to an external clock of the prior art.
Figure 4:
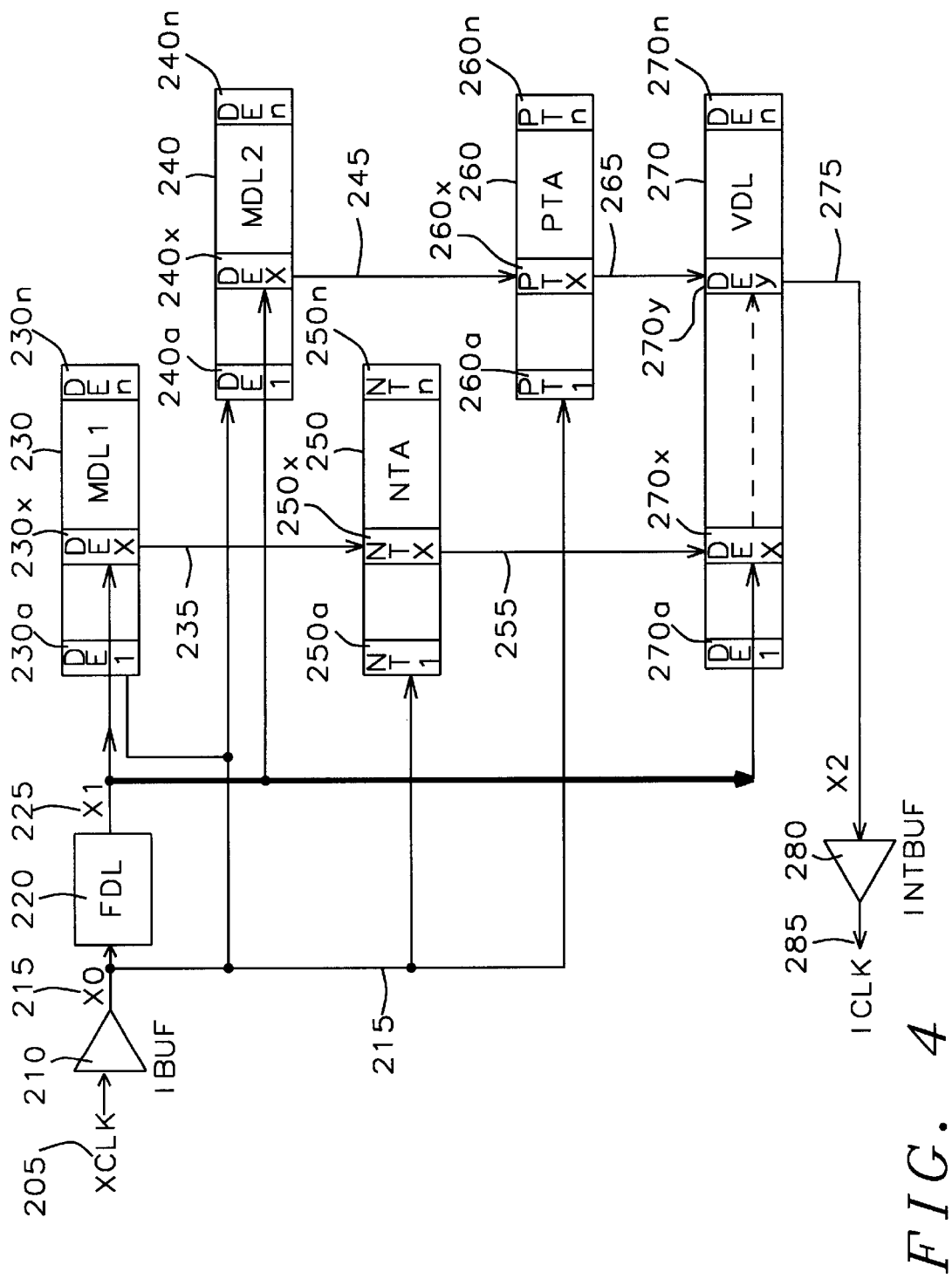
FIG. 4 is a block diagram of a latched type timing signal synchronization circuit of this invention.

Refer now to FIG. 4 for a description of an edge triggered latch type clock synchronized delay circuit of this invention. An external system clock XCLK 205 is the input to an input buffer 210. The input buffer 210 will be essentially a CMOS inverter and will have a delay that is designated the first delay factor d1. The output of the input buffer 210 is the first timing signal $X_0$ 215. The first timing signal $X_0$ 215 is the input to the fixed delay line 220. The first timing signal 215 is delayed by a second delay factor d1+d2 to form the second timing signal $X_1$ 225. The second delay factor d1+d2 is the sum of the first delay factor d1 and a third delay factor d2 that is the delay of the internal buffer 280.

The second timing signal $X_1$ 225 is the input to the first measurement delay line 230. The first measurement delay line 230 is composed of a plurality of serially cascaded delay elements 230a, 230b, . . . , 230x, . . . , 230n.

Each cycle of the external system clock XCLK 205 has a period $\tau_{ck}$ which is divided into two parts. The first part $\tau_a$ of the clock period $\tau_{ck}$ begins with a transition from a first logic level (0) to a second logic level (1) and terminates with a transition from the second logic level (1) to the first logic level (0). While, the second part $\tau_b$ of the clock period $\tau_{ck}$ will begin with the transition from the second logic level (1) to the first logic level (0) and terminate with the transition from the first logic level (0) to the second logic level (1).

The first measurement delay line 230 is a positive edge triggered delay line that will be activated by the rising edge of the first timing signal $X_0$ 215. The rising edge will occur when the first timing signal $X_0$ 215 has transitioned from the first logic level (1) to the second logic level (1).

The first measurement delay line 230 will have multiple outputs 235 that will be inputs to the negative edge triggered latch array 250. The negative edge triggered latch array 250 will be made up of a plurality of negative edge triggered latches. As the second timing signal $X_1$ 225 is transferred through the first measurement delay line 230, the rising edge will eventually be aligned with the falling edge of the first timing signal $X_0$ 215. The falling edge of the first timing signal $X_0$ 215 will be the transition from the second logic level (1) to the first logic level (0). When the alignment of the falling edge of the first timing signal $X_0$ 215 and the rising edge of the second timing signal $X_1$ 225 occurs, the negative triggered latch 250x will be set to transmit a first latch signal 255.

The first timing signal $X_0$ 215 is a triggering input to the second measurement delay line 240 and the second timing signal $X_1$ 225 is the delay input to the second measurement delay line 240. The second measurement delay line 240 is a negative edge triggered delay line. The falling edge of the first timing signal $X_0$ 215 will trigger the second measurement delay line 240 to function. The second measurement delay line 240 will transfer the second timing signal $X_1$ 225 through each delay element 240a, 240b, . . . , 240x, . . . , 240n.

When the falling edge of the second timing signal $X_1$ 225 has aligned with the second rising edge of the first timing signal $X_0$ 215, one of the outputs 245 of the second measurement delay line will be valid. At this time, one of the latches 260x of the positive edge triggered latches 260a, 260b, . . . , 260x, . . . , 260n of the positive latch array 260 will be triggered by the rising edge of the first timing signal $X_0$ 215. The triggering of the positive edge triggered latch 260x will create a second latch signal 265.

The second timing signal $X_1$ 225 is the delay input to the variable delay line 270. The variable delay line 270 will be composed of a plurality of serially cascaded delay elements 270a, 270b, . . . , 270x, . . . , 270n. The first latch signal 255 and the second latch signal 265 will select respectively the delay elements 270x and 270y. The delay element 270x will be situated within the variable delay line 270 such that the second timing signal $X_1$ 225 will be delayed by a fourth delay factor $\tau_{d4}$ that is the difference of the first part $_a$ of the period $\tau_{ck}$ of the external clock XCLK 205 and the second delay factor d1+d2. That is:

$$\tau_{d4}=\tau_a-(d1+d2).$$

The second latch signal 265 will select the delay element 270y to provide the third timing signal $X_2$ 275. The delay elements between the delay element 270x and the delay element 270y will delay the second timing signal $X_1$ 225 by the fifth delay factor $\tau_{d5}$. The fifth delay factor $\tau_{d5}$ will be the second part $\tau_b$ of the period $\tau_{ck}$ of the external clock XCLK 205 less the second delay factor d1+d2. That is:

$$\tau_{d5}=\tau_b-(d1+d2).$$

The output of the variable delay line will be the third timing signal $X_2$ 275. The third timing signal $X_2$ 275 is the input of the internal buffer 280. The output of the internal buffer 280 is the internal clock ICLK 285. The delay of the internal buffer 280 is the third delay factor d2. The total delay $\tau_{dtot}$ from the input of the input buffer 210 to the output of the output buffer 280 will then be:

$$\tau_{dtot}=d1+(d1+d2)+\tau_4+\tau_5+d2$$

$$\tau_{dtot}=d1+(d1+d2)+\tau_a-(d1+d2)+\tau_b-(d1+d2)+d2$$

$$\tau_{dtot}=\tau_a+\tau_b.$$

Thus, the internal clock ICLK 285 will have been synchronized with the external clock XCLK 205 within one cycle of the external clock XCLK 205.

Figure 5:
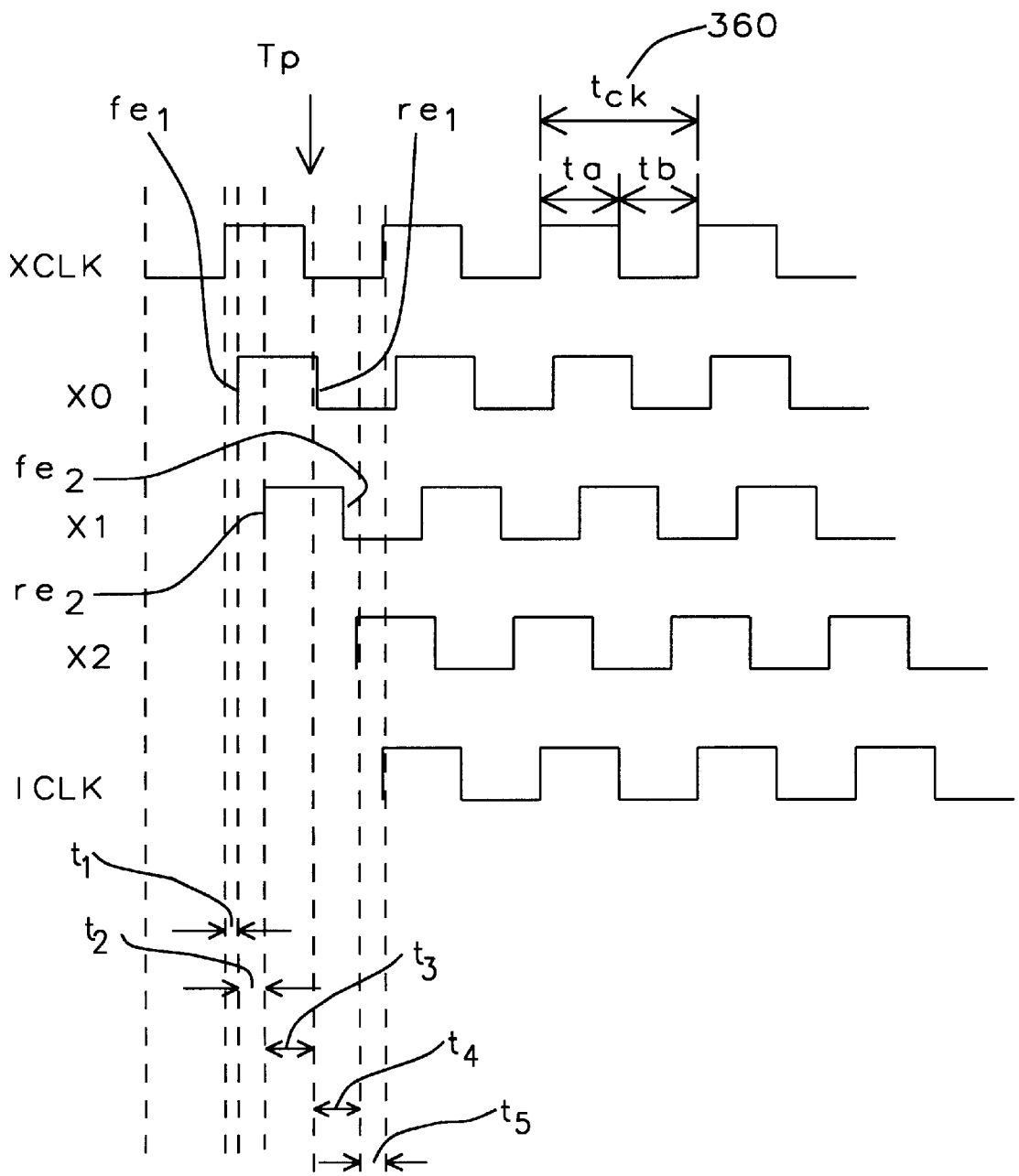
FIG. 5 is a timing diagram of the method to synchronize an internal clock to an external clock to eliminate skew of this invention.

Refer now to FIG. 5 for a discussion of the method to synchronize an internal clock ICLK with and external clock XCLK. The external clock XCLK is received and delayed by a first delay factor $t_1$ to form the first timing signal $X_0$. The first timing signal $X_0$ will be further delayed by a second delay factor $t_2$. The second delay factor $t_2$ will be the fixed sum of the first delay factor $t_1$ and the fifth delay factor $t_5$. The period $\tau_{ck}$ of the external clock XCLK will have two parts $\tau_a$ and $\tau_b$. The first part $\tau_a$ is the part of the period $\tau_{ck}$ of the external clock XCLK that is at the second logic level (1), and the second part $\tau_b$ is the part of the period $\tau_{ck}$ of the external clock XCLK that is at the first logic level (0). The second timing signal $X_1$ will be delayed until its rising edge $re_2$ is aligned with the falling edge $fe_1$ of the first timing signal $X_0$, thus measuring the difference in time $t_3$ of the first part $\tau_a$ of the period $\tau_{ck}$ of the external clock XCLK and the second delay factor $t_2$.

The falling edge $fe_x$ of the external clock XCLK will trigger the delaying of the second timing signal $X_1$ for the time period $t_4$. The time period $t_4$ will be the difference in time between the second part $\tau_b$ of the period $\tau_{ck}$ of the external clock XCLK. The second timing signal $X_1$ will be delayed by the times $t_3$ and $t_4$ to create the third timing signal $X_2$. The third timing signal $X_2$ will be buffered, amplified, and delayed by the fifth delay factor $t_5$ to form the internal clock ICLK. The internal clock ICLK will then be transmitted to the internal circuitry of the integrated circuit.

While this invention has been particularly shown and described with reference to the preferred embodiments thereof, it will be understood by those skilled in the art that various changes in form and details may be made without departing from the spirit and scope of the invention.

The invention claimed is:

1. A timing signal synchronization circuit to synchronize an internal timing signal of an integrated circuit with an external timing signal within one cycle of said external timing signal, comprising:

a) an input buffer subcircuit to receive, buffer, and amplify said external timing signal, whereby said input buffer subcircuit has a first delay factor that is a delay time of a received external timing signal from said external timing signal;

b) a fixed delay line circuit connected to the input buffer subcircuit to delay the received external timing signal by a second delay factor to create a first timing signal;

c) a first measurement delay line connected to the fixed delay line to receive the first timing signal, to measure a first part of a period of said first timing signal and to retain said measurement of said first part of said period;

d) a second measurement delay line connected to the fixed delay line to receive the first timing signal, to measure a second part of the period of said first timing signal and to retain said measurement of said second part of said period;

e) a first latch array connected to the first measurement delay line to receive said measurement of the first period and to create a first latch signal;

f) a second latch array connected to the second measurement delay line to receive said measurement of the second period and to create a second latch signal;

g) a variable delay line connected to the first and second latch array to receive the first and second latch signal to adjust a delay time of said variable delay line to values of the measurements of the first and second parts of the period of the first timing signal less the second delay factor, and connected to the fixed delay line to receive the first timing signal and to delay said first timing signal by the delay time said variable delay line to create a second timing signal; and h) an internal buffer subcircuit to receive, buffer, amplify, and delay by a third delay factor the second timing signal to create the internal timing signal that is synchronized with said external timing signal to circuitry within said integrated circuit.

2. The timing signal synchronization circuit of claim 1 whereby the input buffer subcircuit is a CMOS inverter.

3. The timing signal synchronization circuit of claim 1 wherein the fixed delay line is a plurality of serially cascaded CMOS inverters designed to have a cumulative delay time of the second delay factor.

4. The timing signal synchronization circuit of claim 1 whereby the second delay factor is the sum of the first and third delay factors.

5. The timing signal synchronization circuit of claim 1 wherein the internal buffer subcircuit is a CMOS inverter.

6. A method for synchronizing an internal clock signal within an integrated circuit with an external clock signal within one cycle of an activation of said external clock signal, comprising the steps of:

a) receiving and delaying by a first delay factor the external clock to create a first timing signal;

b) delaying the first timing signal by a second delay factor to create a second timing signal;

c) measuring a first part of a period of the second timing signal;

d) measuring a second part of a period of the second timing signal;

e) retaining the measurement of the first part and the second part of the second timing signal;

f) delaying the second timing signal by a sum of the first and second parts of the period to create a third timing signal; and g) amplifying, buffering, and delaying by a third delay factor said third timing signal for transmission as the internal clock to circuitry within said integrated circuit.

7. The method of claim 6 wherein receiving said external clock signal is in a CMOS inverter.

8. The method of claim 6 wherein delaying the first timing signal is in a fixed delay line that is a plurality of serially cascaded CMOS inverters designed to have a cumulative delay time of the second delay factor.

9. The method of claim 6 whereby the second delay factor is the sum of the first and third delay factors.

10. The method of claim 6 wherein amplifying, buffering, and delaying by the third delay factor said third timing signal is in an internal buffer subcircuit is a CMOS inverter.

* * * * *